US012620566B2

(12) United States Patent
Long

(10) Patent No.: US 12,620,566 B2
(45) Date of Patent: May 5, 2026

(54) RF REFERENCE MEASURING CIRCUIT FOR A DIRECT DRIVE SYSTEM SUPPLYING POWER TO GENERATE PLASMA IN A SUBSTRATE PROCESSING SYSTEM

(71) Applicant: Lam Research Corporation, Fremont, CA (US)

(72) Inventor: Maolin Long, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 56 days.

(21) Appl. No.: 18/830,519

(22) Filed: Sep. 10, 2024

(65) Prior Publication Data

US 2024/0429035 A1      Dec. 26, 2024

Related U.S. Application Data

(63) Continuation of application No. 17/910,785, filed as application No. PCT/US2021/023081 on Mar. 19, 2021, now Pat. No. 12,106,947.

(60) Provisional application No. 62/991,960, filed on Mar. 19, 2020.

(51) Int. Cl.
*H01J 37/32* (2006.01)
*H01L 21/67* (2006.01)
*H03H 7/38* (2006.01)

(52) U.S. Cl.
CPC .. *H01J 37/32935* (2013.01); *H01J 37/32183* (2013.01); *H01L 21/67017* (2013.01); *H03H 7/38* (2013.01)

(58) Field of Classification Search
None
See application file for complete search history.

(56) References Cited

U.S. PATENT DOCUMENTS

| | | | | | |
|---|---|---|---|---|---|
| 6,016,766 | A | * | 1/2000 | Pirkle | H01J 37/32192 |
| | | | | | 315/111.41 |
| 6,080,270 | A | * | 6/2000 | Tabrez | H05B 6/701 |
| | | | | | 156/345.36 |
| 6,200,651 | B1 | * | 3/2001 | Roche | C23C 16/511 |
| | | | | | 427/571 |

(Continued)

FOREIGN PATENT DOCUMENTS

CN            114424319 B   *   4/2024   ........ H01J 37/32165

*Primary Examiner* — Srinivas Sathiraju
(74) *Attorney, Agent, or Firm* — Polygon IP, LLP

(57) ABSTRACT

A substrate processing system includes a drive circuit, an RF reference measuring circuit, and a make-break connector. The drive circuit generates an RF drive signal at a first RF frequency. The RF reference measuring circuit includes an LC circuit having an input impedance and an output impedance. An output of the LC circuit connects to an RF power meter and a dummy load. The make-break connector connects the drive circuit to one of the RF reference measuring circuit and a processing chamber load including a component of the substrate processing system. An output impedance of the drive circuit matches an impedance of an input impedance of the LC circuit. The output impedance of the drive circuit does not match impedances of the RF power meter and the dummy load. The LC circuit matches the impedance of the drive circuit to the RF power meter and the dummy load.

20 Claims, 13 Drawing Sheets

(56)           References Cited

U.S. PATENT DOCUMENTS

| | | | | |
|---|---|---|---|---|
| 7,091,503 | B2 * | 8/2006 | Johnson | H01J 37/32935 |
| | | | | 250/397 |
| 8,736,175 | B2 * | 5/2014 | Long | H01J 37/32935 |
| | | | | 315/111.21 |
| 9,515,633 | B1 * | 12/2016 | Long | H01J 37/32119 |
| 9,839,109 | B1 * | 12/2017 | Leray | H05H 1/46 |
| 9,865,432 | B1 * | 1/2018 | Bhutta | H01L 21/31116 |
| 10,121,641 | B2 * | 11/2018 | Long | H01J 37/32715 |
| 10,264,663 | B1 * | 4/2019 | Long | H01J 37/32174 |
| 10,515,781 | B1 * | 12/2019 | Long | H03K 5/135 |
| 10,553,465 | B2 * | 2/2020 | Augustyniak | H01J 37/32385 |
| 10,622,962 | B2 * | 4/2020 | Kapoor | C23C 16/52 |
| 10,638,593 | B2 * | 4/2020 | Long | H01J 37/32183 |
| 10,784,083 | B2 * | 9/2020 | Long | H01J 37/32715 |
| 10,847,345 | B2 * | 11/2020 | Long | H03K 5/135 |
| 11,101,372 | B2 * | 8/2021 | Wood | H10D 84/121 |
| 11,183,406 | B2 * | 11/2021 | Augustyniak | H01L 21/67069 |
| 11,570,879 | B2 * | 1/2023 | Ye | H01J 37/32165 |
| 11,823,928 | B2 * | 11/2023 | Augustyniak | H01L 21/67167 |
| 11,956,883 | B2 * | 4/2024 | Ye | H05H 1/46 |
| 12,106,947 | B2 * | 10/2024 | Long | H03H 7/40 |
| 2004/0021094 | A1 * | 2/2004 | Johnson | H01J 37/32935 |
| | | | | 250/397 |
| 2011/0115379 | A1 * | 5/2011 | Long | H01J 37/32935 |
| | | | | 315/111.21 |
| 2016/0358755 | A1 * | 12/2016 | Long | H01J 37/32155 |
| 2017/0365907 | A1 * | 12/2017 | Kapoor | C23C 16/458 |
| 2018/0025930 | A1 * | 1/2018 | Augustyniak | H01L 21/68771 |
| | | | | 438/798 |
| 2018/0358205 | A1 * | 12/2018 | Long | H01J 37/3244 |
| 2019/0051497 | A1 * | 2/2019 | Long | H01J 37/32577 |
| 2019/0107558 | A1 * | 4/2019 | Long | H01J 37/32082 |
| 2019/0116656 | A1 * | 4/2019 | Long | H03F 3/2173 |
| 2019/0214236 | A1 * | 7/2019 | Marohl | H01L 21/67109 |
| 2019/0215942 | A1 * | 7/2019 | Long | H01J 37/32183 |
| 2019/0363196 | A1 * | 11/2019 | Wood | H10D 12/00 |
| 2019/0385821 | A1 * | 12/2019 | Long | H01J 37/32183 |
| 2020/0083022 | A1 * | 3/2020 | Huang | H01L 21/31116 |
| 2020/0118856 | A1 * | 4/2020 | Augustyniak | H01L 21/68771 |
| 2020/0321455 | A1 * | 10/2020 | Wood | H10D 62/177 |
| 2021/0013915 | A1 * | 1/2021 | Schoessow | H03H 7/46 |
| 2021/0210314 | A1 * | 7/2021 | Wang | H01J 37/32165 |
| 2021/0351178 | A1 * | 11/2021 | Wood | H10D 84/121 |
| 2022/0051919 | A1 * | 2/2022 | Augustyniak | H01L 21/67288 |
| 2022/0108875 | A1 * | 4/2022 | Thie | H01J 37/32091 |
| 2022/0172933 | A1 * | 6/2022 | Kapoor | H01J 37/32174 |
| 2022/0375725 | A1 * | 11/2022 | Peng | H01J 37/3244 |
| 2023/0113683 | A1 * | 4/2023 | Long | H03H 7/40 |
| | | | | 315/111.21 |
| 2023/0131809 | A1 * | 4/2023 | Ye | H01J 37/32935 |
| | | | | 315/111.21 |
| 2023/0245873 | A1 * | 8/2023 | Long | H01J 37/32935 |
| | | | | 315/111.21 |
| 2024/0055285 | A1 * | 2/2024 | Augustyniak | H01L 21/67167 |
| 2024/0429035 | A1 * | 12/2024 | Long | H03H 7/40 |

* cited by examiner

RF REFERENCE MEASURING CIRCUIT FOR A DIRECT DRIVE SYSTEM SUPPLYING POWER TO GENERATE PLASMA IN A SUBSTRATE PROCESSING SYSTEM

CLAIM OF PRIORITY

This patent application claims the benefit of and priority, under 35 U.S.C. § 120, to U.S. patent application Ser. No. 17/910,785, filed on Sep. 9, 2022, and titled "RF REFERENCE MEASURING CIRCUIT FOR A DIRECT DRIVE SYSTEM SUPPLYING POWER TO GENERATE PLASMA IN A SUBSTRATE PROCESSING SYSTEM", which is a national stage filing of and claims priority, under 35 U.S.C. § 371, to PCT/US2021/023081, filed on Mar. 19, 2021 and titled "RF REFERENCE MEASURING CIRCUIT FOR A DIRECT DRIVE SYSTEM SUPPLYING POWER TO GENERATE PLASMA IN A SUBSTRATE PROCESSING SYSTEM", which claims the benefit of and priority, under 35 U.S.C. § 119 (e), to U.S. Provisional Application No. 62/991,960, filed on Mar. 19, 2020, and titled "RF REFERENCE MEASURING CIRCUIT FOR A DIRECT DRIVE SYSTEM SUPPLYING POWER TO GENERATE PLASMA IN A SUBSTRATE PROCESSING SYSTEM", all of which are incorporated by reference herein in their entirety.

FIELD

The present disclosure relates to substrate processing systems and more particularly to a radio frequency (RF) reference measuring circuit to measure an RF reference generated by a direct drive system supplying RF power to a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to etch thin film on substrates such as semiconductor wafers. Etching usually includes either wet chemical etching or dry etching. Dry etching may be performed using plasma generated by inductively-coupled plasma (ICP). A magnetic field is generated by one or more inductive coils arranged outside of a processing chamber adjacent to a dielectric window. Process gas flowing inside the processing chamber is ignited by the magnetic field to create plasma. In some applications, RF bias power may also be supplied to an electrode in the substrate support.

The frequency of the RF plasma power or RF bias power can be varied to provide additional process control. In addition, a magnitude or level of the RF plasma power or the RF bias power can be varied during processing to provide additional process control. Changes in the RF plasma power or level and/or the RF bias power or level can cause changes in the impedance seen by the drive circuit. When an impedance mismatch occurs between the load and the drive circuit, power is reflected, which is inefficient.

SUMMARY

A substrate processing system comprises a drive circuit, an RF reference measuring circuit, and a make-break connector. The drive circuit is configured to generate an RF drive signal at a first RF frequency. The RF reference measuring circuit includes an LC circuit having an input impedance and an output impedance. An output of the LC circuit is configured to connect to an RF power meter and a dummy load. The make-break connector is configured to connect the drive circuit to one of the RF reference measuring circuit and a processing chamber load including a component of the substrate processing system. An output impedance of the drive circuit matches an impedance of an input impedance of the LC circuit. The output impedance of the drive circuit does not match impedances of the RF power meter and the dummy load. The LC circuit is configured to match the impedance of the drive circuit to the RF power meter and the dummy load.

In other features, the RF reference measuring circuit includes a first conductor connected to an output of the LC circuit and the RF power meter is connected to the first conductor.

In other features, the RF reference measuring circuit includes a second conductor connected to an output of the RF power meter and the dummy load is connected to the second conductor.

In other features, the output impedance of the drive circuit, and the input impedance of the LC circuit are in a range from $0.1\Omega$ to $10\Omega$.

In other features, the output impedance of the drive circuit, and the input impedance of the LC circuit are in a range from $0.5\Omega$ to $2\Omega$.

In other features, the output impedance of the LC circuit and impedances of the RF power meter, the dummy load, the first conductor and the second conductor are in a range from $20\Omega$ to $100\Omega$.

In other features, the output impedance of the LC circuit and the impedances of the RF power meter, the dummy load, the first conductor and the second conductor are in a range from $45\Omega$ to $55\Omega$.

In other features, the LC circuit includes a first connector connected to the make-break connector, an inductor having one end connected to the first connector, a first capacitor connected in series with an opposite end of the inductor, and a second capacitor connected in parallel between the opposite end of the inductor and the first capacitor.

In other features, the first capacitor includes one or more ceramic capacitors having first terminals connected to the second capacitor and second terminals connected to a second connector.

In another feature, the second conductor includes a coaxial cable.

In another feature, the second capacitor includes one or more vacuum capacitors.

In other features, the input impedance of the LC circuit is in a range from $0.5\Omega$ to $2\Omega$, and the output impedance of the LC circuit is in a range from $45\Omega$ to $55\Omega$.

In another feature, the RF first frequency is in a range from 1.8 MHz to 2.2 MHz.

In other features, the LC circuit includes a first connector connected to the make-break connector, an inductor having one end connected to the first connector, a first capacitor connected in series with an opposite end of the inductor, and a second capacitor connected in parallel to an opposite end of the first capacitor.

In another feature, the first capacitor and the second capacitor include one or more vacuum capacitors.

In another feature, the first RF frequency is in a range from 12.35 MHz to 13.65 MHz.

In other features, the make-break connector includes a bracket, a first conductor extending from one side of the bracket, a second conductor extending from an opposite side of the bracket and connected to the first conductor, and a connector removably attached to the second conductor and configured to connect the second conductor to the RF reference measuring circuit and not to the drive circuit. The connector is T-shaped and includes a body connected to the second conductor and a cylindrical portion extending from the body and including a cavity. The cavity of the cylindrical portion is configured to connect to the RF reference measuring circuit.

In other features, the make-break connector includes a bracket, a first conductor extending from one side of the bracket, a second conductor extending from an opposite side of the bracket and connected to the first conductor, and a connector configured to removably attach to the second conductor and to connect the second conductor to the drive circuit and not to the RF reference measuring circuit. The connector includes a body, a bore in the body and a fastener extending through the bore to connect the body to the second conductor.

In other features, the make-break connector includes a bracket, a first conductor extending from one side of the bracket, a second conductor extending from an opposite side of the bracket and connected to the first conductor, and a connector configured to removably attach to the second conductor and to connect the second conductor to one of the RF reference measuring circuit and the drive circuit. The connector includes a T-shaped connector.

In other features, the T-shaped connector includes a first leg and a second leg including first and second cavities, respectively. The first leg and the second leg are slidably received on the second conductor. The T-shaped connector includes a third leg arranged transverse to the first leg and the second leg and including a cavity configured to connect to the RF reference measuring circuit.

In other features, the T-shaped connector includes a body including a bore, a fastener extending through the bore to connect the body to the second conductor, and a cylindrical portion extending from the body and including a cavity configured to connect to the RF reference measuring circuit.

In other features, the cylindrical portion has an axis, and the fastener is connected in a direction transverse to the axis.

In other features, the cylindrical portion has an axis, and the fastener is connected in a direction parallel to the axis.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
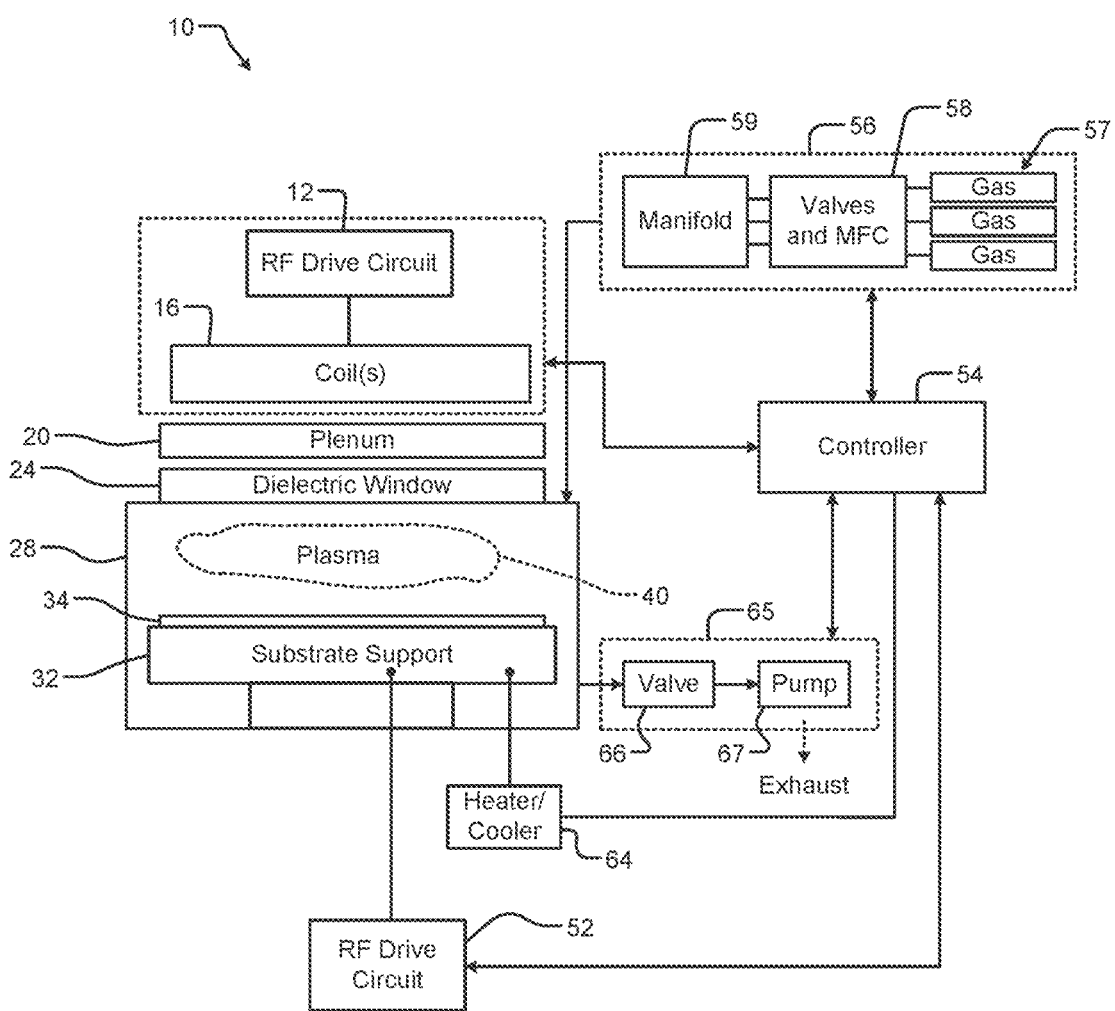
FIG. 1 is a functional block diagram of an example of a substrate processing system including one or more RF direct drive circuits according to the present disclosure.

In some applications, an RF frequency of the RF source power or RF bias power supplied to the ICP coil and/or to an electrode in the substrate support is switched between two or more frequencies and/or two or more pulsing levels. RF pulsing at more than one frequency and/or more than one level is shown and described in commonly-assigned U.S. Pat. No. 9,515,633 entitled "Transformer Coupled Capacitive Tuning Circuit with Fast Impedance Switching for Plasma Etch Chambers", which is hereby incorporated by reference in its entirety.

In these systems, an impedance of an RF generator is matched to a load (such as the inductive coils and the plasma or the electrode and the plasma). However, the impedance of the load changes as the plasma conditions vary, the pulsing level changes, and/or due to various other factors. When impedance mismatch occurs, power is reflected by the load, which is inefficient. Tuning of the circuits using variable capacitors is difficult due to the amount of time that is required to change the value of the capacitance relative to the switching period between frequency changes and/or level to level changes.

To alleviate some of the foregoing problems, RF direct drive circuits having low output impedance can be used. In some examples, the impedance of the RF direct drive circuits is predominantly resistive and has a relatively low resistance (e.g. such as about 1 (2). For example, direct drive and hybrid direct drive circuits are shown in commonly-assigned U.S. patent application Ser. No. 16/007,481, filed on Jun. 13, 2018, and titled "Direct Drive RF Circuit for Substrate Processing Systems", which is hereby incorporated by reference in its entirety. Additional examples of direct drive circuits are shown and described in U.S. Patent Publication No. 2019/0007004, entitled "High Gain Resonant Amplifier for Resistance Output Impedance", published on Jan. 3, 2019, which is hereby incorporated by reference in its entirety.

To ensure that the substrate processing systems operate within desired operating parameters (such as non-uniformity), the RF power or RF bias output by the direct drive system should be measured periodically (or on an event basis) and calibrated if needed. However, it is difficult to measure the output of the direct drive circuit since it has a relatively low impedance as compared to impedances of existing coaxial cables, RF power meters and/or dummy loads that are commercially available and/or otherwise already located in the fab room. Most existing coaxial cables, RF power meters and/or dummy loads have impedances of about 50Ω. Systems and methods described herein are used to measure one or more parameters of the RF power and/or RF bias signals generated by the RF direct drive systems.

Systems and methods according to the present disclosure include a make-break connector arranged between the direct drive circuit and a processing chamber load (e.g. a component of the processing chamber and/or plasma). The make-break connector connects the direct drive circuit to the processing chamber load or to an RF reference measuring circuit including a dummy load. The RF reference measuring circuit includes an LC circuit having an input impedance that matches an impedance of the direct drive circuit and an output impedance that matches an impedance of the coaxial cables, RF power meter and dummy load. This allows measurements to be made with existing RF power meters, coaxial cables and dummy loads, which reduces cost.

Referring now to FIG. 1, an example of a substrate processing system 10 according to the present disclosure is shown. The substrate processing system 10 includes an RF drive circuit 12. The RF drive circuit 12 may include an RF source and a matching network or a direct drive circuit described herein.

In some examples, a plenum 20 may be arranged between the coils 16 and a dielectric window 24 to control the temperature of the dielectric window 24 with hot and/or cold air flow. The dielectric window 24 is arranged along one side of a processing chamber 28. The processing chamber 28 further comprises a substrate support (or pedestal) 32. The substrate support 32 may include an electrostatic chuck (ESC), a mechanical chuck, or other type of chuck. Process gas is supplied to the processing chamber 28 and plasma 40 is generated inside of the processing chamber 28. The plasma 40 etches an exposed surface of the substrate 34.

An RF drive circuit 52 may be used to provide an RF bias to an electrode in the substrate support 32 during operation. The RF drive circuit 52 may include an RF source and a matching network or a direct drive circuit (described herein). At least one of the RF drive circuits 12 and/or 52 includes an RF direct drive circuit.

A gas delivery system 56 may be used to supply a process gas mixture to the processing chamber 28. The gas delivery system 56 may include process and inert gas sources 57, a gas metering system 58 such as valves and mass flow controllers, and a manifold 59. Gas such as air may be used to cool the coils 16 and the dielectric window 24. A heater/cooler 64 may be used to heat/cool the substrate support 32 to a predetermined temperature. An exhaust system 65 includes a valve 66 and pump 67 to remove reactants from the processing chamber 28 by purging or evacuation. A controller 54 may be used to control the etching process. The controller 54 monitors system parameters and controls delivery of the gas mixture, striking, maintaining and extinguishing the plasma, removal of reactants, supply of cooling gas, and so on.

Figure 2A:
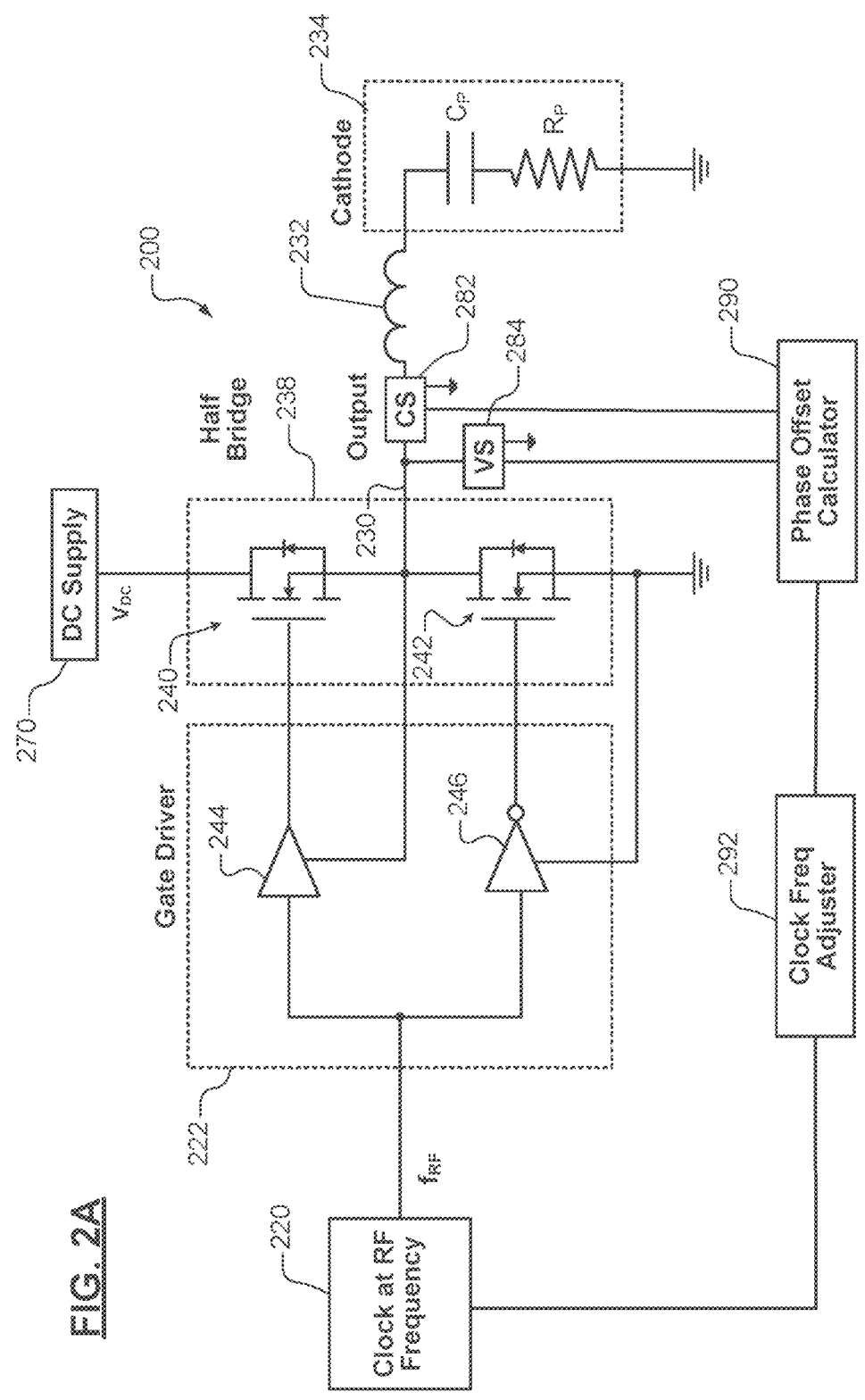
FIGS. 2A and 2B are functional block diagrams and electrical schematics of examples of RF direct drive circuits according to the present disclosure.
Figure 2B:
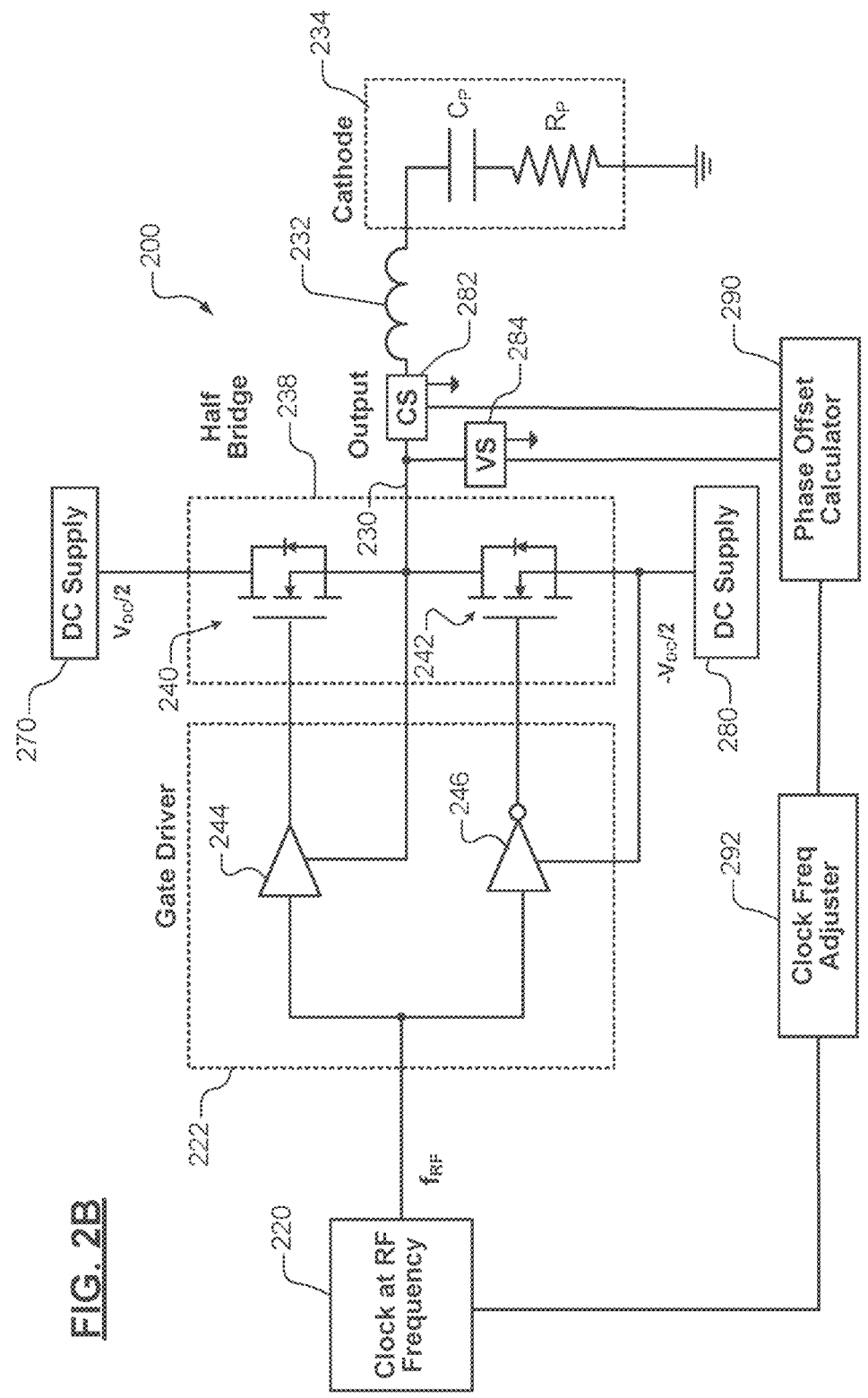

Referring now to FIGS. 2A and 2B, an example of an RF direct drive circuit 200 for supplying the RF bias or the RF plasma power is shown. In FIG. 2A, the RF direct drive circuit 200 includes a clock 220 that operates at one or more selected RF frequencies. The clock signal output by the clock 220 is input to a gate driver circuit 222. In some examples, the gate driver circuit 222 includes an amplifier 244 and an inverting amplifier 246 having respective inputs connected to the clock 220.

Outputs of the gate driver circuit 222 are input to a half bridge circuit 238. In some examples, the half bridge circuit 238 includes a first switch 240 and a second switch 242. In some examples, the first switch 240 and the second switch 242 include metal oxide semiconductor field effect transistors (MOSFETs). The first switch 240 and the second switch 242 each include a control terminal, and first and second terminals. An output of the amplifier 244 of the gate driver circuit 222 is input to the control terminal of the first switch 240. An output of the inverting amplifier 246 of the gate driver circuit 222 is input to the control terminal of the second switch 242.

An output node 230 is connected to the second terminal of the first switch 240 and to the first terminal of the second switch 242. The first terminal of the first switch 240 is connected to a first DC supply 270. The second terminal of the second switch 242 is connected to a reference potential such as ground.

The output node 230 is connected by an inductor 232 to a cathode 234. In some examples, a capacitance $C_p$ in series with a resistance $R_p$ may be used to model the impedance seen by the RF direct drive circuit 200 (e.g. plasma capacitance and resistance, the capacitance and resistance of the electrode (or another component) in the substrate support and/or other stray or parasitic capacitance and resistance).

The RF direct drive circuit in FIG. 2B includes first and second DC supplies 270, 280 operating at $+V_{DC}/2$ and $-V_{DC}/2$, respectively, to remove DC bias. In some examples, to achieve the same output RF power, both the first and second DC supplies 270, 280 operate at half the voltage of the single DC supply in FIG. 2A. In some examples, the first DC supply 270 and the second DC supply 280 operate at approximately the same magnitude and opposite polarity. As used herein, approximately the same refers to a difference between a magnitude of the DC voltage output by the first DC supply 270 relative to the second DC supply 280 that is less than 20%, 5% or 2%. The first DC supply 270 is connected to the first terminal of the first switch 240. The second DC supply 280 is connected to the second terminal of the second switch 242.

In some examples, a current sensor 282 and a voltage sensor 284 sense current and voltage at the output node 230. A phase offset calculator 290 receives sensed current and voltage signals and generates a phase offset signal that is output to a clock frequency adjuster 292. The clock frequency adjuster 292 generates a clock adjustment signal based on the phase offset signal. In other features, the clock frequency adjuster 292 increases the frequency of the clock 220 when the current leads the voltage and decreases the frequency of the clock 220 when the voltage leads the current.

Figures 3A, 3B:
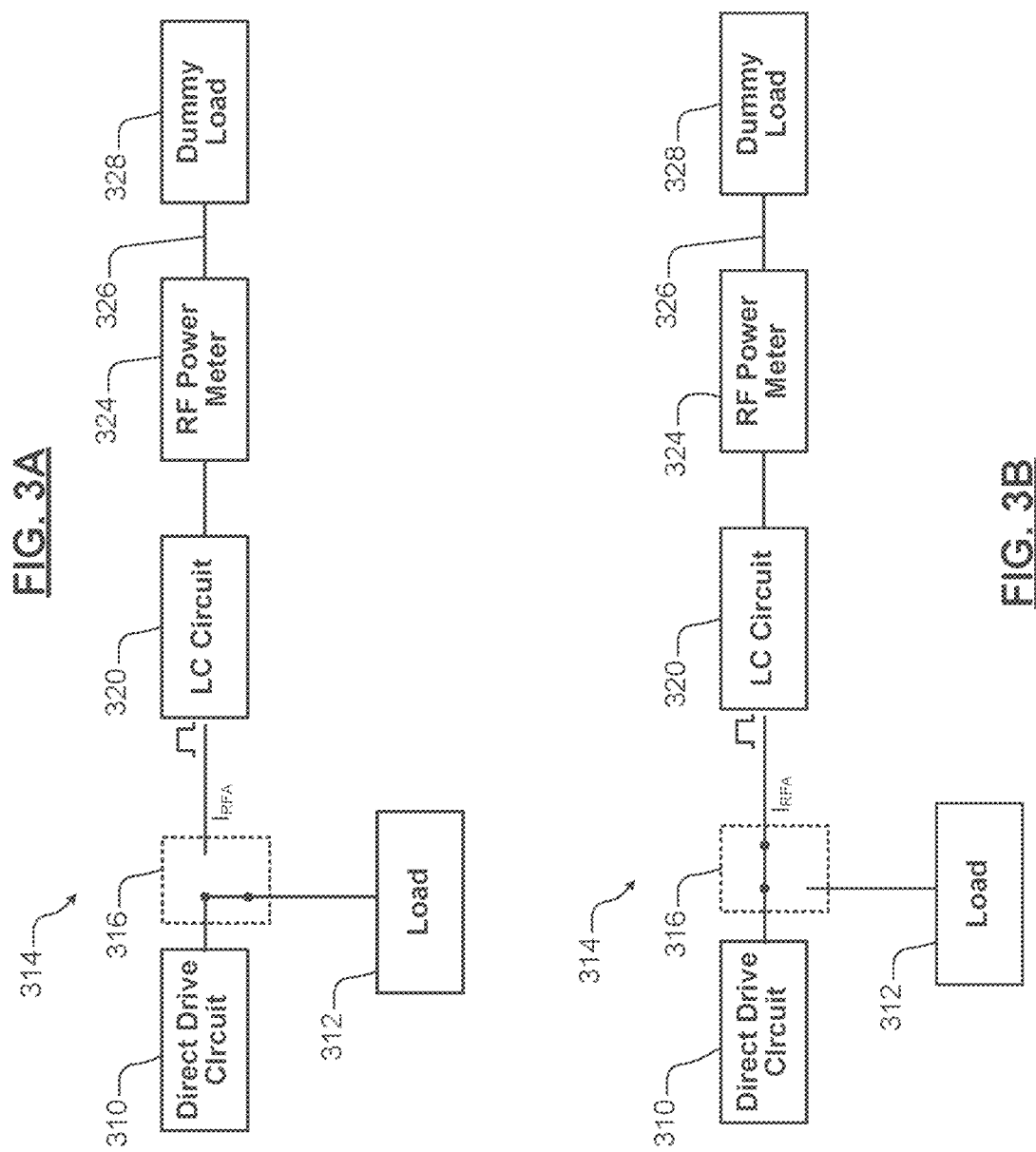
FIG. 3A is a functional block diagram of an example of an RF direct drive circuit connected to a load according to the present disclosure.
FIG. 3B is a functional block diagram of an RF direct drive circuit connected to an RF reference measuring circuit according to the present disclosure.

Referring now to FIGS. 3A and 3B, a direct drive circuit 310 can be connected to a load 312 such as a component of the processing chamber or to an RF reference measuring circuit 314 that performs measurements to evaluate operation of the direct drive circuit 310. In FIG. 3A, a make-break connector 316 is configured to connect the direct drive circuit 310 to the load 312 during the normal operating mode. The make-break connector 316 may include fasteners, conductors, and/or other hardware that is manually attached and/or removed to make and/or break the appropriate connections. During operation in the normal operating mode, the direct drive circuit 310 drives the load 312 as described above.

Periodically or on an event basis, the output of the direct drive circuit is tested to ensure that the processing chamber is operating correctly. However, the dummy loads, the RF power meter and the coaxial cable connectors have a much higher impedance that does not match the output impedance of the direct drive circuit.

In FIG. 3B, the make-break connector 316 is configured to connect the direct drive circuit 310 to an LC circuit 320 during the RF reference measuring mode. An output of the LC circuit 320 is connected to the RF power meter 324. A conductor 326 connects the RF power meter 324 to a dummy load 328. In some examples, the conductor 326 includes a coaxial cable, although other conductors can be used.

The output impedance of the direct drive circuit 310 is not matched to the impedance of the conductor 326, the impedance of the RF power meter 324 and the impedance of the dummy load. In some examples, an output impedance of the direct drive circuit 310 is in a range from 0.1 ohms ($\Omega$) to 5$\Omega$. In some examples, an output impedance of the direct drive circuit 310 is in a range from 0.5 ohms ($\Omega$) to 2$\Omega$.

In some examples, an impedance of the conductor 326 and the RF power meter 324 is greater than the output impedance of the direct drive circuit 310. For example, the impedance of the conductor 326, the RF power meter 324 and the dummy load 328 may be in a range from 20 ohms ($\Omega$) to 100$\Omega$. For example, the impedance of the conductor 320, the RF power meter 324, and the dummy load 328 may be in a range from 45 ohms ($\Omega$) to 55$\Omega$. For example, the impedance of the conductor 320 and the RF power meter 324 may be 50$\Omega$.

Figure 4:
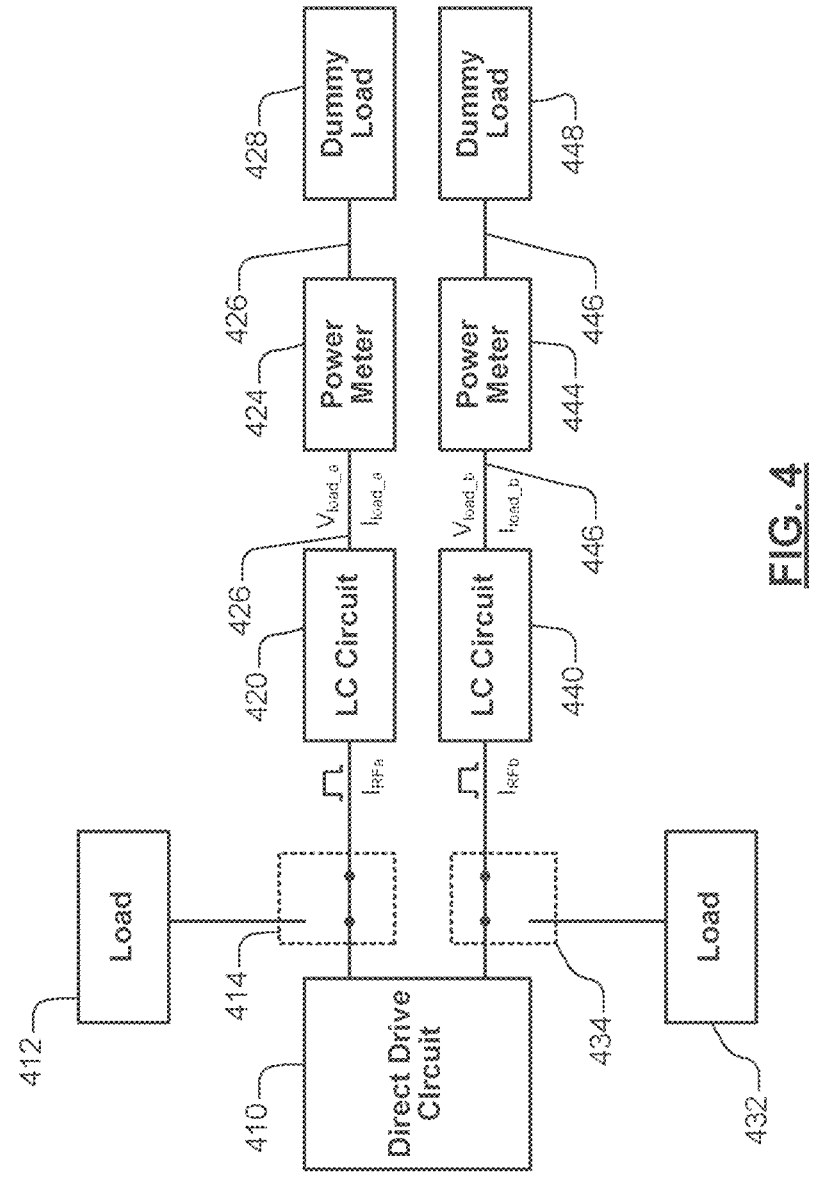
FIG. 4 is a functional block diagram of an example of an RF direct drive circuit operating at first and second RF ranges and first and second RF reference measuring circuits according to the present disclosure.

Referring now to FIG. 4, a direct drive circuit 410 is shown in the RF reference measuring mode. The direct drive circuit 410 includes first and second outputs in a first frequency range and a second frequency range. In some examples, the first frequency range is from 1.8 MHz to 2.2 MHz, although other frequency ranges can be used. In some examples, the second frequency range is from 12.35 MHz to 13.65 MHz, although other frequency ranges can be used.

A make-break connector 414 connects a first output of the direct drive circuit 410 to the LC circuit 420 during a first reference measuring mode or to a load 412 during a first direct drive mode. The LC circuit 420 is connected by a conductor 426 to an RF power meter 424. A conductor 426 connects the RF power meter 424 to a dummy load 428. In some examples, the conductors 426 include coaxial cables.

A make-break connector 434 connects a second output of the direct drive circuit 410 to an LC circuit 440 during a second RF reference measuring mode or to a load 432 such as a component of the processing chamber during a second direct drive mode. In some examples, the loads 412 and 432 are the same load or separate loads. The LC circuit 440 is connected by a conductor 446 to an RF power meter 444. A conductor 446 connects the RF power meter 444 to a dummy load 448. In some examples, the conductors 446 include coaxial cables.

Figure 5:
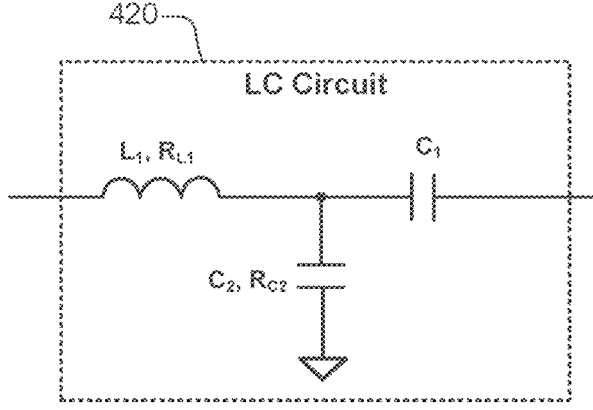
FIG. 5 is an electrical schematic of an example of an LC circuit for the first RF reference according to the present disclosure.

Referring now to FIG. 5, an example of the LC circuit 420 for the first frequency range is shown. The LC circuit 420 includes an inductor $L_1$ (having a resistance $R_{L1}$) connected in series with a capacitor $C_1$. A capacitor $C_2$ is connected between the inductor $L_1$ and the capacitor $C_1$. In some examples, the LC circuit 420 has an input impedance that matches an impedance of the direct drive circuit and an output impedance that matches an impedance of the connectors, the RF meter and the dummy load.

Figure 6:
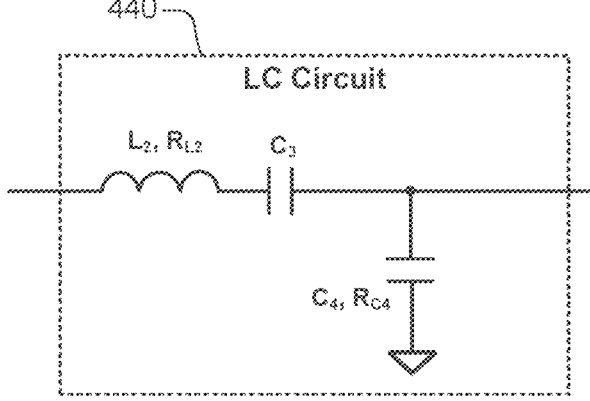
FIG. 6 is an electrical schematic of an example of an LC circuit for the second RF reference according to the present disclosure.

Referring now to FIG. 6, an example of the LC circuit 440 for the second frequency range is shown. The LC circuit 440 includes an inductor L2 (having a resistance $R_{L2}$) connected in series with a capacitor $C_3$. A capacitor $C_4$ is connected between the capacitor $C_3$ and an output of the LC circuit 440. In some examples, the LC circuit 440 has an input impedance that matches an impedance of the direct drive circuit and an output impedance that matches an impedance of the connectors, the RF meter and the load.

Figure 7:
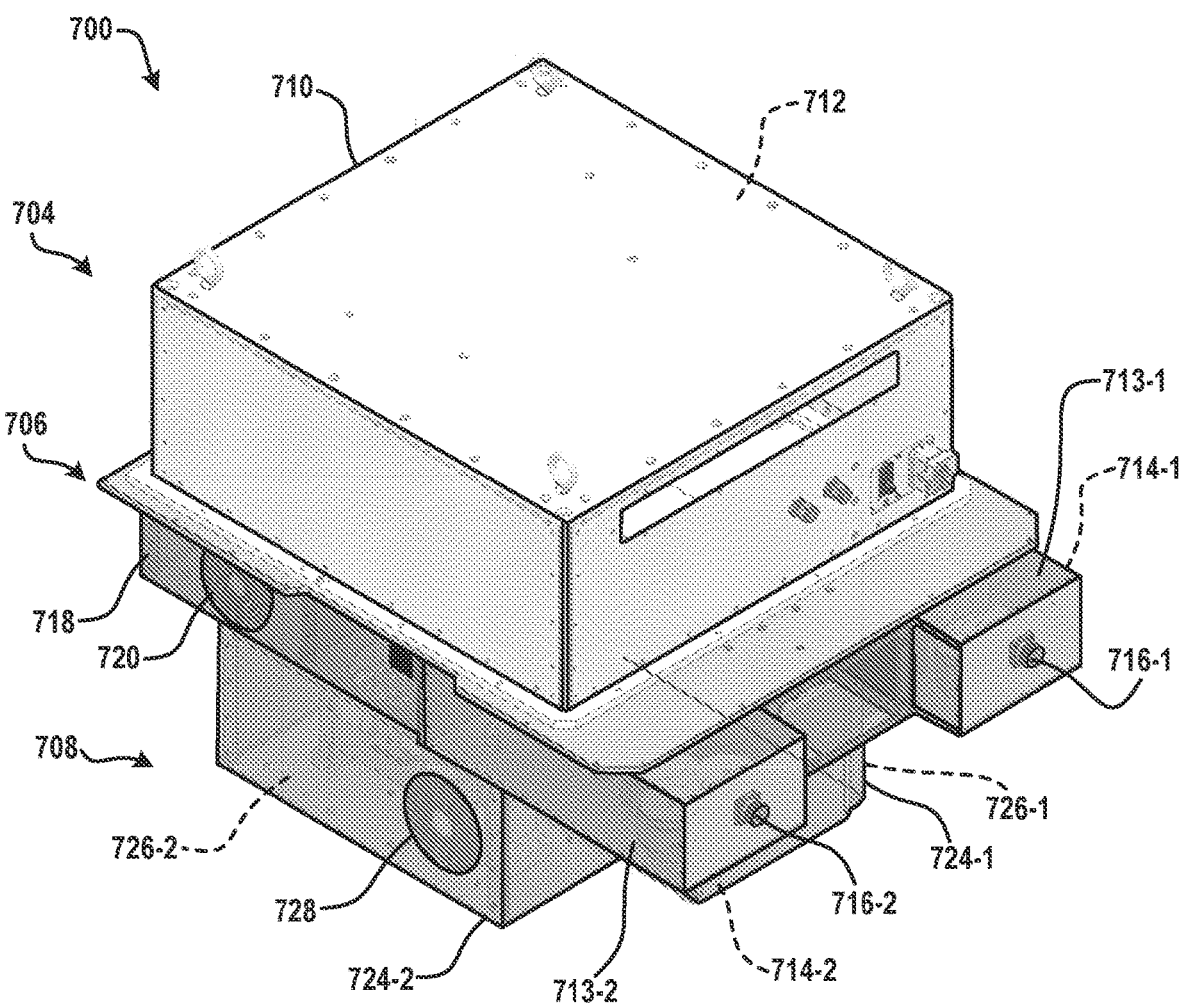
FIG. 7 is a perspective view of an example of a direct drive system according to the present disclosure.

Referring now to FIG. 7, an example of a direct drive system 700 is shown. The direct drive system 700 includes multiple stacked enclosures defining an upper level 704, a middle level 706, and a lower level 708. In some examples, the direct drive system 700 may be arranged above a processing chamber. In some examples, side walls and upper and lower surfaces are made of a conducting material such as aluminum.

The upper level 704 includes an enclosure 710 housing a direct drive circuit 712 described above. In some examples, the middle level 706 includes multiple enclosures. An enclosure 713-1 houses a first RF reference measuring circuit 714-1 and includes a connector 716-1 (such as a coaxial connector) located on an outer wall of the enclosure 713-1. The middle level 706 further includes an enclosure 713-2 housing a second RF reference measuring circuit 714-2 and including a connector 716-2 (such as a coaxial connector) located on an outer wall of the enclosure 713-2.

In some examples, the enclosure 713-1 is arranged in a parallel and spaced relationship relative to the enclosure 713-2. In some examples, the middle level 706 may include one or more additional enclosures (such as an enclosure 718). In some examples, one or more of the enclosures of the middle level 706 include one or more fans 720 to circulate air within the enclosures.

The lower level 708 includes an enclosure 724-1 housing a first make-break connector 726-1. The first make-break connector 726-1 connects one of the outputs of the direct drive circuit 712 to the first RF reference measuring circuit 714-1 or to a component of the processing chamber (such as an inductive coil or electrode in a substrate support) or to disconnect the direct drive circuit 712 from both the first RF reference measuring circuit 714-1 and the component of the processing chamber.

The lower level 708 further includes another enclosure 724-2 housing a second make-break connector 726-2 to connect one of the outputs of the direct drive circuit 712 to the second RF reference measuring circuit 714-2 or to a component of the processing chamber or to disconnect the direct drive circuit 712 from both the second RF reference measuring circuit 714-2 and the component of the processing chamber.

Figure 8A:
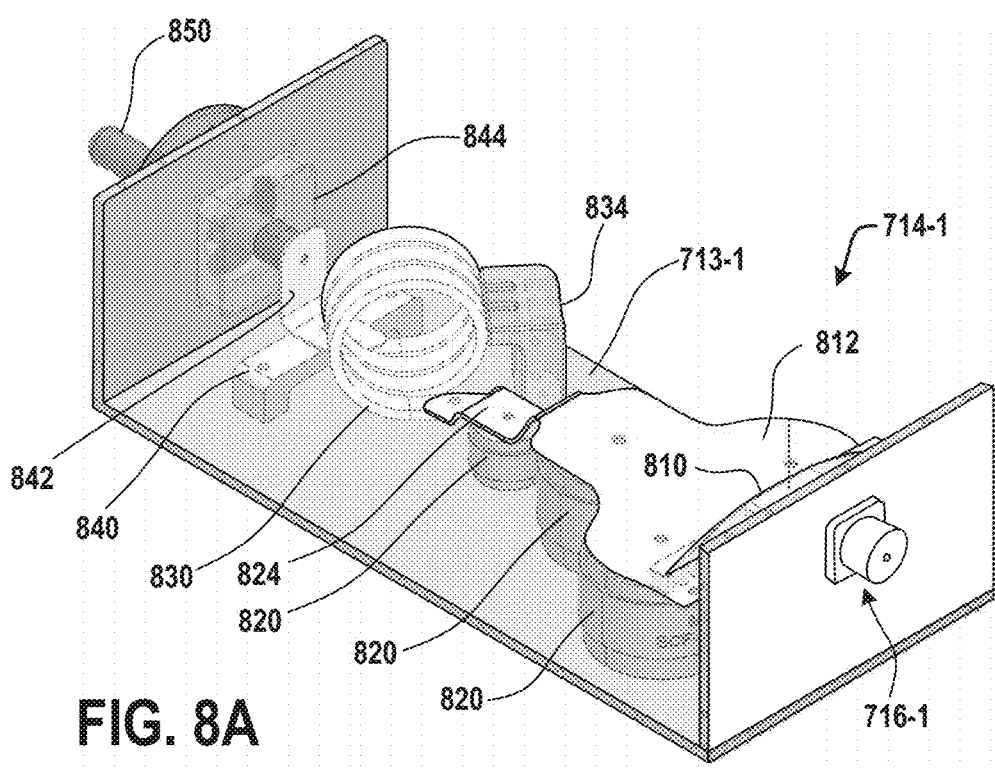
FIGS. 8A and 8B are perspective views of examples of a first RF reference measuring circuit for a direct drive system according to the present disclosure.
Figure 8B:
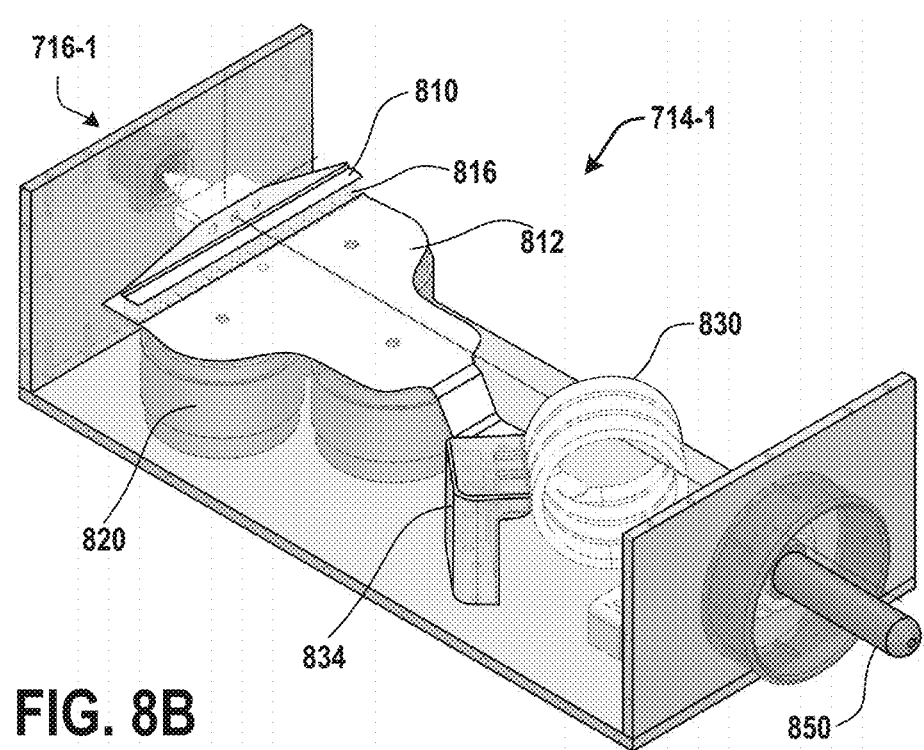

Referring now to FIGS. 8A and 8B, the first RF reference measuring circuit 714-1 for a direct drive system is shown. The first RF reference measuring circuit 714-1 includes a plate 810 electrically connected to the connector 716-1. The plate 810 is also connected to first terminals of one or more capacitors 816 that are connected in parallel to the plate 810. Second terminals of the one or more capacitors 816 are connected to a plate 812. In some examples, the capacitors 816 include ceramic capacitors, although other types of capacitors can be used.

One or more capacitors 820 are connected in parallel between the plate 812 and a reference potential. For example, the reference potential may be provided by a grounded lower surface of the enclosure. In some examples, the capacitors include vacuum capacitors. An extension 824 of the plate 812 is connected to one end of an inductor 830. In some examples, the inductor 830 includes a conducting material that is wound in a spiral coil. In some examples, the conducting material includes copper or silver (Ag) plated copper. An opposite end of the inductor 830 is connected to one end of a plate 842. In some examples, windings of the inductor 830 are held in a spaced relationship by a separator 834 extending therebetween. In some examples, the separator 834 includes a body 835 and a plurality of projections 836 extending from the body 835 at spaced locations. Ends of the plurality of projections 836 are located between the windings of the inductor 830. In some examples, the separator 834 is made of a non-conducting material such as plastic, although other materials can be used. In some examples, the separator 834 is made of polyether ether ketone (PEEK). An opposite end of the plate 842 is connected to a connector 844. The connector 844 extends through the enclosure to a connector 850. In some examples, the connector 850 includes a male connector having a cylindrical body.

Figure 9A:
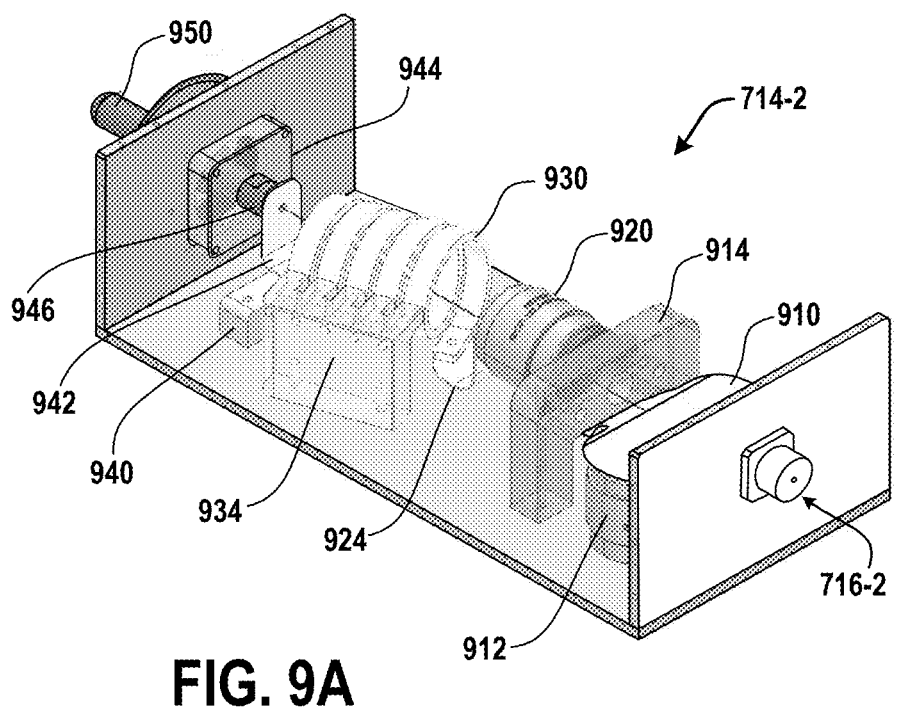
FIGS. 9A and 9B are perspective views of examples of a second RF reference measuring circuit for a direct drive system according to the present disclosure.
Figure 9B:
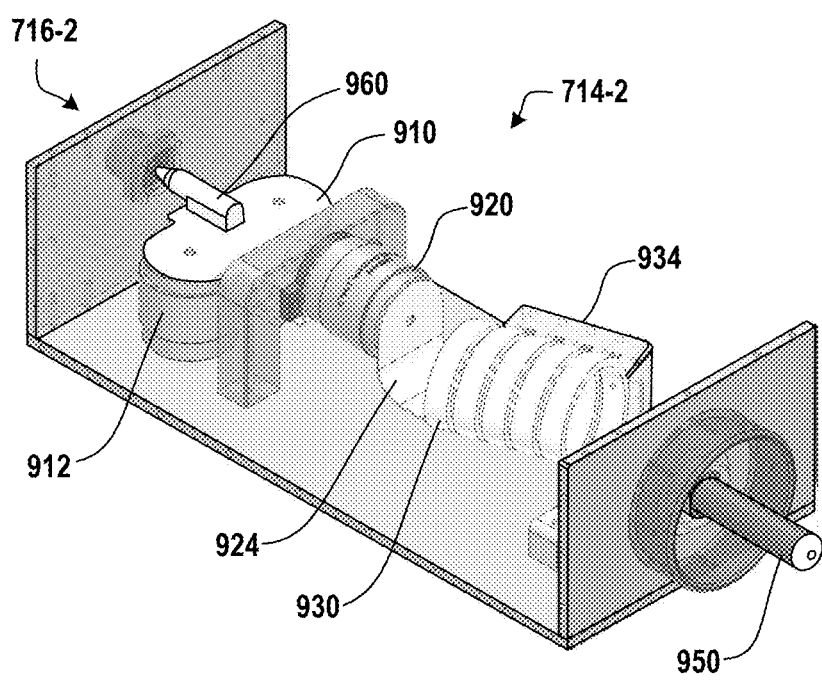

Referring now to FIGS. 9A and 9B, the second RF reference measuring circuit 714-2 for the direct drive system is shown. The second RF reference measuring circuit 714-2 includes a plate 910 connected to the connector 716-1. One or more capacitors 912 are connected in parallel between the plate 910 and a reference potential (such as ground—e.g. a grounded enclosure wall). An extension 924 of the plate 910 is connected to one end of an inductor 930. An opposite end of the inductor 930 is connected to one end of a plate 942. In some examples, windings of the inductor 930 are separated by a separator 934.

An opposite end of the plate 942 is connected to a connector 944. The connector 944 extends through the enclosure to a connector 950. In some examples, the connector 950 includes a male connector such as a cylindrical conducting portion.

Figures 10A, 10B:
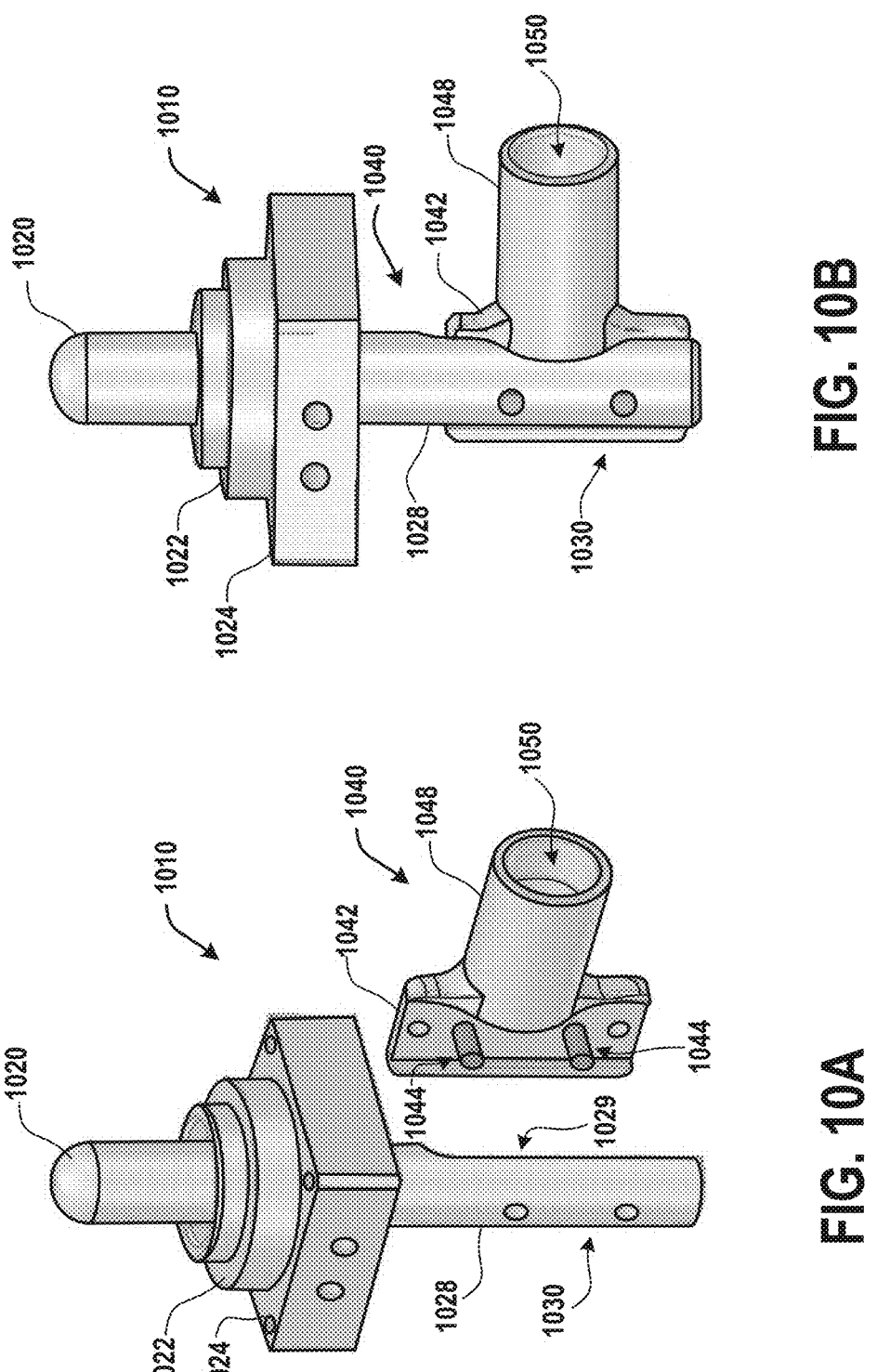
FIGS. 10A and 10B are perspective views of examples of an upper portion of a make-break connector for a direct drive system according to the present disclosure.

Referring now to FIGS. 10A and 10B, an upper portion of a make-break connector 1010 for a direct drive system is shown. The make-break connector 1010 includes a conductor 1020 surrounded by one or more ring portions 1022 and 1024 and a base portion 1024. In some examples, the one or more ring portions 1022 and 1024 have a centering function to a female connector of the direct drive circuit. In some examples, the conductor 1020 includes a cylindrical conducting portion, although other shapes can be used.

A conductor 1028 extends downwardly from the base portion 1024 and is electrically connected to the conductor 1020. In some examples, the conductor 1028 has a cylindrical shape and includes an attachment portion 1029 configured to receive a T-shaped connector 1040. In some examples, the attachment portion 1029 defines a flat surface to mate with a flat surface of a body 1042 of the T-shaped connector 1040.

The T-shaped connector 1040 includes a cylindrical portion 1048 extending from the body 1042 and defining a central cavity 1050. In some examples, the central cavity 1050 is cylindrical and is configured to receive one of the connectors 850, 950. In some examples, the T-shaped connector 1040 includes one or more fasteners 1044 such as threaded bolts that are received in the bores 1030 to attach the T-shaped connector 1040 to the conductor 1028. In some examples, the fasteners 1044 extend in a direction transverse to an axis of the central cavity 1050. While a specific configuration for the make-break connector 1010 is shown, other configurations can be used.

Figure 11:
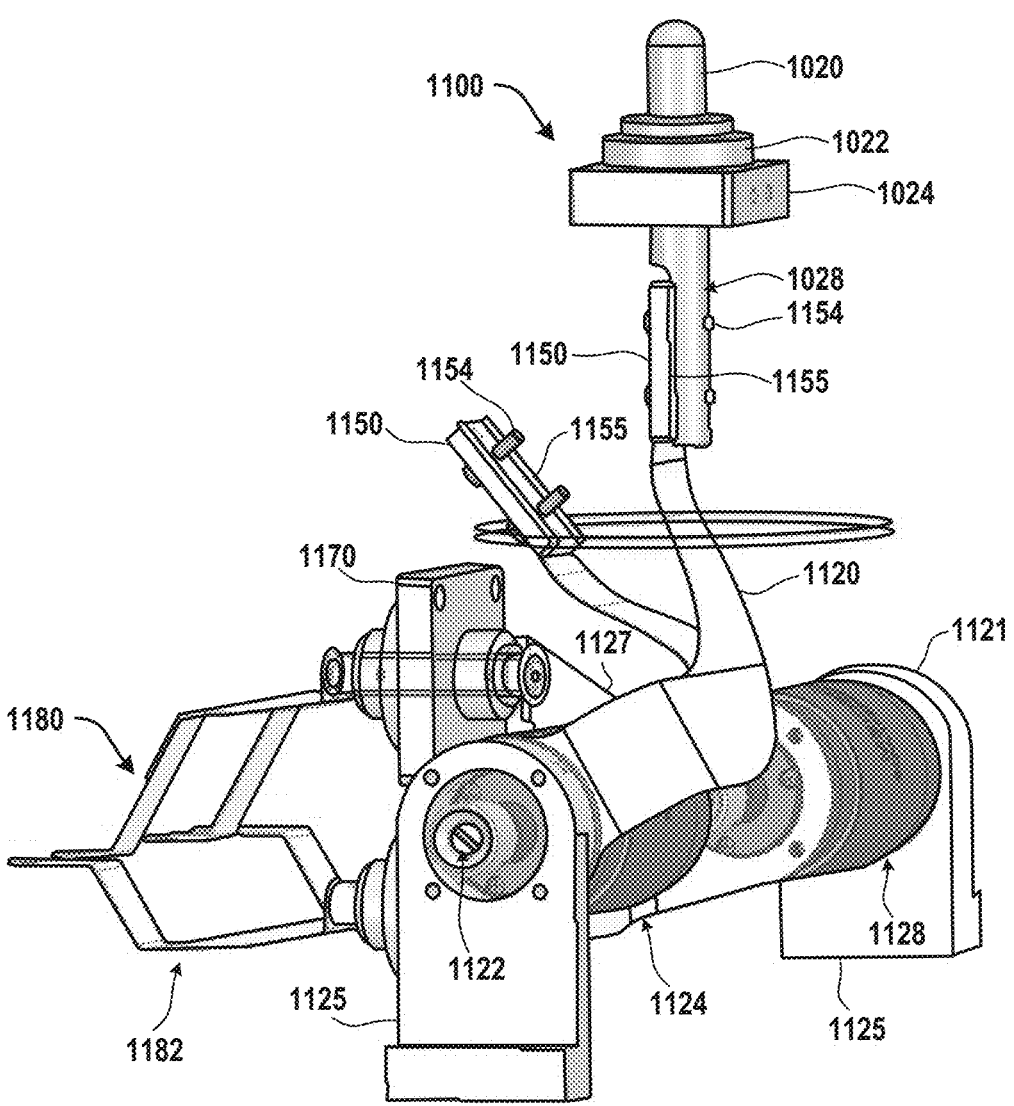
FIG. 11 are perspective views of examples of a make-break connector for a direct drive system according to the present disclosure.

Referring now to FIG. 11, a make-break connector 1100 for a direct drive system is shown. A connector 1150 is shown in direct drive mode (connected) and RF reference measuring mode (disconnected). In some examples, the connector 1150 includes a rectangular body and one or more flanges 1155 running along opposite sides of the rectangular body. One or more fasteners 1154 connect and position the connector 1150 relative to the conductor 1028.

The connector 1150 is attached to or integrated with a strap 1120. The strap 1120 is connected to a capacitor 1124 supported (fixed or rotatably) at one end by a supporting bracket 1125. An opposite end of the capacitor 1124 is connected to a strap 1227 (connected to a bracket 1170) and one end of a capacitor 1128. An opposite end of the capacitor is connected to a support bracket 1125. In some examples, the bracket 1170 is connected to an enclosure wall. In some examples, the strap 1120 can be rotated relative to the mounting brackets 1125. A conductor 1134 is connected by conductors 1180, 1182 to a component of the processing chamber.

Figure 12A:
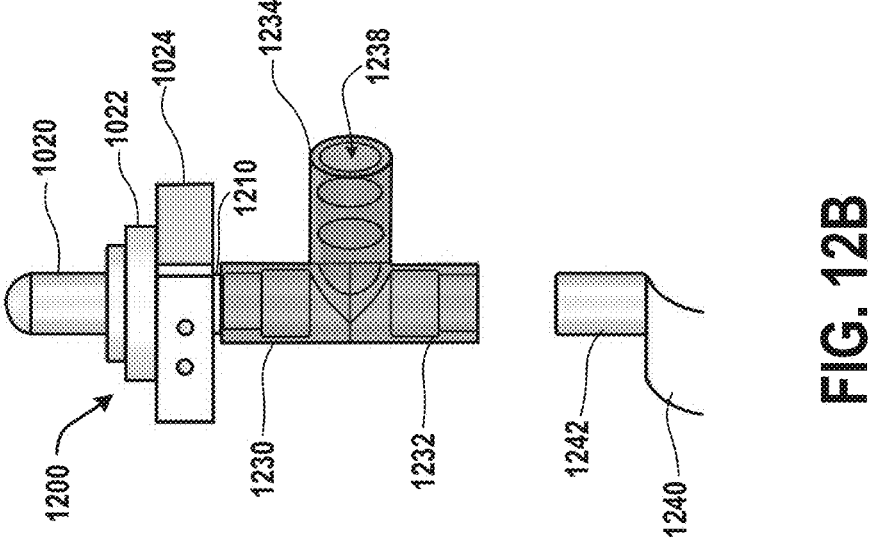
FIGS. 12A and 12B are perspective views of examples of an upper portion of a make-break connector for a direct drive system according to the present disclosure.
Figure 12B:
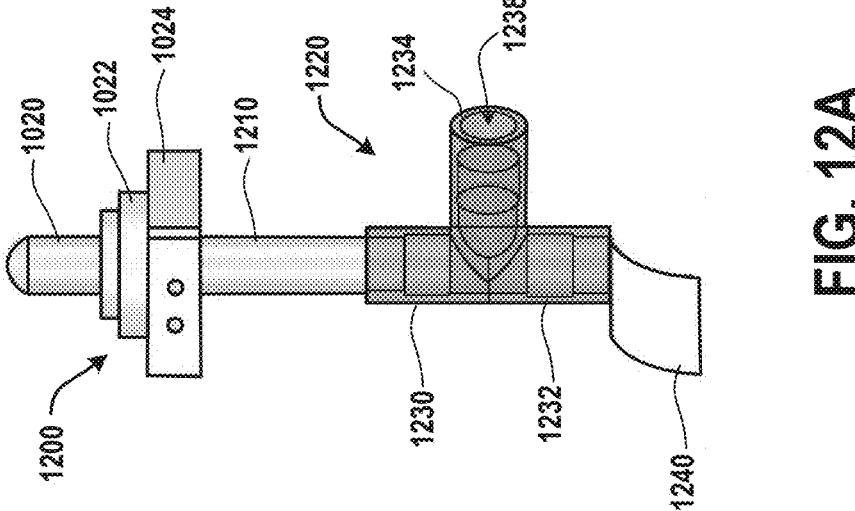

Referring now to FIGS. 12A and 12B, an upper portion of another example of a make-break connector 1200 for a direct drive system is shown. Instead of using the conductor 1028 with the attachment portion 1029, a conductor 1210 and a T-shaped sliding connector 1220 are used. In some examples, the conductor 1210 has a cylindrical shape. The conductor 1210 is slidably received by a conducting cylindrical inner cavity of the T-shaped sliding connector 1220. The T-shaped sliding connector 1220 includes first leg 1230 and a second leg 1232 that are axially aligned. The first leg 1230 is connected to the conductor 1210. The T-shaped sliding connector 1220 includes a third leg 1234 that is arranged transverse to the first leg 1230 and the second leg 1232. A conducting cavity 1238 of the third leg 1234 is configured to connect to one of the connectors 850, 950 when arranged in the RF reference measuring mode.

In FIG. 12A, the second leg 1232 is shown connected to a mating connector 1242 (best seen in FIG. 12B) extending from the strap 1120 (instead of the connector 1150) when arranged in the direct drive mode. The third leg 1234 is disconnected from the connectors 850, 950.

In FIG. 12B, the second leg 1232 is disconnected from mating connector 1242 and the third leg 1234 is connected to one of the connectors 850, 950 when in the RF reference measuring mode. As can be appreciated, the T-shaped sliding connector 1220 allows rapid reconfiguration between the direct drive mode and the RF reference measuring mode.

Figure 13:
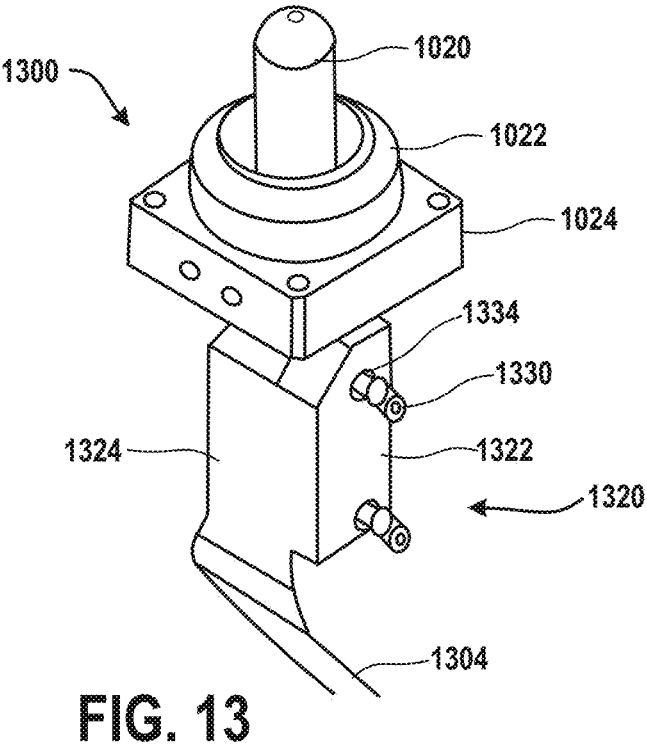
FIG. 13 is a perspective view of another example of an upper portion of a make-break connector for a direct drive system according to the present disclosure.

Referring now to FIG. 13, an upper portion of another make-break connector 1300 is shown in a direct drive mode. An upper portion of a strap 1304 (similar to 1120 but having a different end configuration) is also shown. The strap 1304 includes an "L"-shaped end 1320 including a first portion 1322 and a second portion 1324. In some examples, the first portion 1322 lies transverse to the second portion 1324. The first portion 1322 further includes one or more bores 1334 to receive one or more threaded fasteners 1330, respectively. In FIG. 13, the strap 1304 is connected to the make-break connector 1300 in a plane that is transverse to a plane including a widest portion of the strap 1304 (in contrast to FIG. 11 which is parallel).

Figure 14:
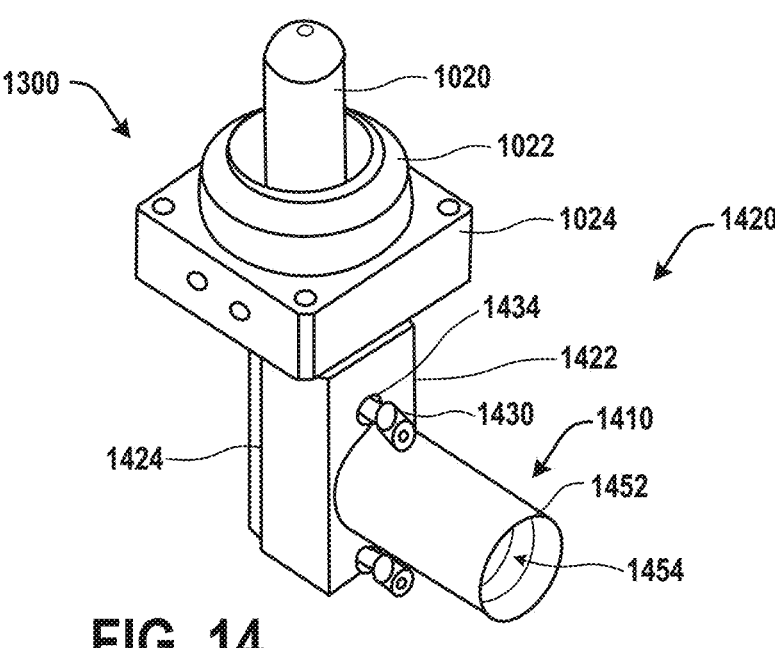
FIG. 14 is a perspective view of another example of an upper portion of a make-break connector for a direct drive system according to the present disclosure.

Referring now to FIG. 14, an upper portion of the make-break connector 1300 is shown configured in the RF reference measuring mode. The upper portion of the strap 1304 is disconnected. In some examples, the strap 1304 is rotated about the supporting brackets 1125 away from the upper portion of the make-break connector 1300. A T-shaped connector 1410 includes an "L"-shaped end 1420 including a first portion 1422 and a second portion 1424. In some examples, the first portion 1422 lies transverse to the second portion 1424. The first portion 1422 further includes one or more bores 1434 to receive one or more threaded fasteners 1430, respectively. The T-shaped connector 1410 includes a cylindrical portion 1452 defining an inner cavity 1454 to receive one of the connectors 850 or 950. In this example, the fasteners attach in a direction parallel to the axis of the cavity (unlike other versions that are attached in a transverse direction). Adjusting the location of the fasteners makes the T-shaped connector 1410 easier to attach.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The invention claimed is:

1. A system comprising:
a drive circuit configured to generate a first radio frequency (RF) signal at a first frequency and a second RF signal at a second frequency; and
a plurality of inductor-capacitor circuits coupled to the drive circuit to receive the first and second RF signals, wherein the plurality of inductor-capacitor circuits are configured to match an impedance of the drive circuit with a first impedance of a first plurality of components including a first power meter and a first dummy load and with a second impedance of a second plurality of components including a second power meter and a second dummy load.

2. The system of claim 1, wherein the drive circuit includes:
a clock configured to operate at the first radio frequency or the second radio frequency;
a gate driver coupled to the clock, wherein the gate driver has a plurality of outputs; and
a half bridge circuit coupled to the plurality of outputs of the gate driver.

3. The system of claim 1, wherein the first frequency is within a first frequency range from 1.8 megahertz (MHz) to 2.2 MHz and the second frequency is within a second frequency range from 12.35 MHz to 13.65 MHz.

4. The system of claim 1, wherein the plurality of inductor-capacitor circuits include a first inductor-capacitor circuit and a second inductor-capacitor circuit, wherein the first inductor-capacitor circuit is configured to match the impedance of the drive circuit with the first impedance and the second inductor-capacitor circuit is configured to match the impedance of the drive circuit with the second impedance.

5. The system of claim 4, wherein the first inductor-capacitor circuit includes:
an inductor;
a first capacitor coupled to the inductor at a point;
a second capacitor coupled to the inductor at the point, wherein the second capacitor is coupled to ground.

6. The system of claim 4, wherein the second inductor-capacitor circuit includes:
an inductor;
a first capacitor coupled in series with the inductor;
a second capacitor coupled to the first capacitor, wherein the second capacitor is coupled to ground.

7. The system of claim 4, wherein the drive circuit has a first output and a second output, wherein the first inductor-capacitor circuit is coupled via a first connector to the first output and the second inductor-capacitor circuit is coupled via a second connector to the second output.

8. The system of claim 7, wherein the first output of the drive circuit is configured to be decoupled from the first inductor-capacitor circuit to be coupled via the first connector to a first plasma processing chamber load, wherein the second output of the drive circuit is configured to be decoupled from the second inductor-capacitor circuit to be coupled via the second connector to a second plasma processing chamber load.

9. The system of claim 1, wherein the first plurality of components include a first conductor between the first RF power meter and the first dummy load and the second plurality of components include a second conductor between the second RF power meter and the second dummy load.

10. A system comprising:
a first inductor-capacitor circuit configured to be coupled to a drive circuit to receive a first radio frequency (RF) signal from the drive circuit; and
a second inductor-capacitor circuit configured to be coupled to the drive circuit to receive a second RF signal from the drive circuit,
wherein when the first and second RF signals are received, the first and second inductor-capacitor circuits are configured to match an impedance of the drive circuit with a first impedance of a first plurality of components including a first power meter and a first dummy load and with a second impedance of a second plurality of components including a second power meter and a second dummy load.

11. The system of claim 10, wherein the first inductor-capacitor circuit includes:
an inductor;
a first capacitor coupled to the inductor at a point;
a second capacitor coupled to the inductor at the point, wherein the second capacitor is coupled to ground.

12. The system of claim 10, wherein the second inductor-capacitor circuit includes:
an inductor;
a first capacitor coupled in series with the inductor;
a second capacitor coupled to the first capacitor, wherein the second capacitor is coupled to ground.

13. The system of claim 10, wherein the first inductor-capacitor circuit is configured to be coupled to the drive circuit via a first connector and the second inductor-capacitor circuit is configured to be coupled to the drive circuit via a second connector.

14. The system of claim 10, wherein the first plurality of components include a first conductor between the first RF power meter and the first dummy load and the second plurality of components include a second conductor between the second RF power meter and the second dummy load, wherein the first frequency is within a first frequency range from 1.8 megahertz (MHz) to 2.2 MHz and the second frequency is within a second frequency range from 12.35 MHz to 13.65 MHz.

15. A method comprising:
generating, by a drive circuit, a first radio frequency (RF) signal at a first frequency and a second RF signal at a second frequency; and
receiving, by a plurality of inductor-capacitor circuits, the first and second RF signals, wherein the first and second RF signals are received to match an impedance of the drive circuit with a first impedance of a first plurality of components including a first power meter and a first dummy load and with a second impedance of a second plurality of components including a second power meter and a second dummy load.

16. The method of claim 15, wherein the drive circuit includes:

a clock configured to operate at the first radio frequency or the second radio frequency;

a gate driver coupled to the clock, wherein the gate driver has a plurality of outputs; and a half bridge circuit coupled to the plurality of outputs of the gate driver.

17. The method of claim 15, wherein the plurality of inductor-capacitor circuits include a first inductor-capacitor circuit and a second inductor-capacitor circuit, wherein the first inductor-capacitor circuit is configured to match the impedance of the drive circuit with the first impedance and the second inductor-capacitor circuit is configured to match the impedance of the drive circuit with the second impedance.

18. The method of claim 17, wherein the first inductor-capacitor circuit includes:

an inductor;

a first capacitor coupled to the inductor at a point;

a second capacitor coupled to the inductor at the point, wherein the second capacitor is coupled to ground, wherein the second inductor-capacitor circuit includes:

an inductor;

16 a first capacitor coupled in series with the inductor;

a second capacitor coupled to the first capacitor, wherein the second capacitor is coupled to ground.

19. The method of claim 17, wherein the drive circuit has a first output and a second output, wherein the first inductor-capacitor circuit is coupled via a first connector to the first output and the second inductor-capacitor circuit is coupled via a second connector to the second output, the method comprising:

decoupling the first output of the drive circuit from the first inductor-capacitor circuit to couple the first output via the first connector to a first plasma processing chamber load; and decoupling the second output of the drive circuit from the second inductor-capacitor circuit to couple the second output via the second connector to a second plasma processing chamber load.

20. The method of claim 15, wherein the first plurality of components include a first conductor between the first RF power meter and the first dummy load and the second plurality of components include a second conductor between the second RF power meter and the second dummy load, wherein the first frequency is within a first frequency range from 1.8 megahertz (MHz) to 2.2 MHz and the second frequency is within a second frequency range from 12.35 MHz to 13.65 MHz.

* * * * *